US006744276B1

(12) United States Patent
Hauke et al.

(10) Patent No.: US 6,744,276 B1
(45) Date of Patent: Jun. 1, 2004

(54) SERIAL DIGITAL AUDIO DATA PORT WITH MULTIPLE FUNCTIONAL CONFIGURATIONS

(75) Inventors: Michael T. Hauke, Nevada City, CA (US); Jerzy Pacak, Orangevale, CA (US); David R. Costa, Nevada City, CA (US); Steven E. Miller, Nevada City, CA (US)

(73) Assignee: Grass Valley (US), Inc., Nevada City, CA (US)

( * ) Notice: Subject to any disclaimer, the term of this patent is extended or adjusted under 35 U.S.C. 154(b) by 0 days.

(21) Appl. No.: 10/062,076

(22) Filed: Jan. 31, 2002

(51) Int. Cl.[7] .............................................. H03K 17/16
(52) U.S. Cl. .......................................... 326/30; 326/82
(58) Field of Search .............................. 326/26, 30, 82

(56) References Cited

U.S. PATENT DOCUMENTS 5,781,028 A * 7/1998 Decuir ........................ 326/30
6,256,686 B1 7/2001 Cornwell ..................... 710/62

* cited by examiner

*Primary Examiner*—Daniel D. Chang
(74) *Attorney, Agent, or Firm*—Joseph S. Tripoli; Harvey D. Fried; Robert B. Levy

(57) ABSTRACT

A bidirectional serial port for digital audio data includes a cable connector for coupling the port to a cable, a cable driver having a serial digital audio signal as an input and also having an output, a receiver having an input and an output, and an impedance and level matching network coupled to the output of the cable driver, the input of the receiver, and the cable connector. The port can be selectively configured either as an input port by causing the impedance and level matching network to act as a cable termination or as an output port by allowing the serial digital audio signal to pass through the cable driver and the impedance and level matching network to the cable connector.

15 Claims, 3 Drawing Sheets

SERIAL DIGITAL AUDIO DATA PORT WITH MULTIPLE FUNCTIONAL CONFIGURATIONS

BACKGROUND OF THE INVENTION

This invention relates to a serial digital audio data port with multiple functional configurations.

AES3-1992 prescribes a signal format for digital audio data. A signal in this format is sometimes known as an AES3 signal, or simply as an AES signal, and has two channels which may be related, for example as left and right stereo channels.

AES3-1992 specifies that the AES signal should be transmitted in balanced form over a shielded twisted pair cable. AES3-1992 specifies that in this case the cable should have a characteristic impedance of 110 ohms at frequencies from 100 kHz to 128 times the maximum frame rate, or 6.144 MHz for a frame rate of 48 kHz, that the driver should have a balanced output with an internal impedance of 110 ohms +/−20% over the same frequency range and that the receiver should present an essentially resistive impedance of 110 ohms +/−20% over the same frequency range.

SMPTE 276M-1995 describes a point-to-point coaxial cable interface for the transmission of AES digital audio signals throughout television production and broadcast facilities. In accordance with SMPTE 276M, the generator or driver must have a source impedance of 75 ohms over the frequency band 0.1 MHz to 6.0 MHz and the receiver must present an impedance of 75 ohms over the same frequency band. In a given facility, AES signals may be transmitted both in balanced form and in unbalanced form.

SMPTE 259M-1993 (hereinafter referred to simply as SMPTE 259) defines the serial digital interface (SDI) signal format for video. The SDI signal format specifies locations at which ancillary data can be accommodated in the field of a composite digital video signal or a component digital video signal.

SMPTE 272M-1994 (hereinafter referred to simply as SMPTE 272) defines the mapping of AES digital audio data into the horizontal ancillary data space of the SDI data stream, resulting in a serial data stream including both video data and audio data. The process by which AES digital audio data is inserted in the horizontal ancillary data space of the SDI data stream is referred to as embedding or multiplexing. Conversely, the process by which digital audio data is extracted from the horizontal ancillary data space of a serial data stream including both video data and audio data is referred to as disembedding or demultiplexing. See, for example, D. K. Fibush, "Integrating Digital Audio into the Serial Digital Video Signal," *SMPTE JOURNAL*, September 1994, 574–579 and U.S. Pat. No. 5,483,538.

Powerful digital signal processing techniques allow different configurations of a given product to perform different functions. For example, with relatively minor variations in control and software, a given functional module may be used either to embed digital audio data in a digital video data stream, according to SMPTE 272M, or to disembed digital audio data from a digital video data stream. Operating as an embedder, this module would require one or more audio inputs (as well as a video input and a video output), whereas it would require an audio output rather than an audio input when operating as a disembedder. A port that could be configured either as an audio input or as an audio output could be used to provide an audio connection to either module.

U.S. patent application Ser. No. 09/977,655 filed Oct. 12, 2001, discloses a routing switch having variable input/output configuration. This function requires that some ports should operate selectively either as input ports or output ports, depending on the required configuration.

U.S. Pat. No. 6,256,686 discloses a bidirectional serial video port.

SUMMARY OF THE INVENTION

In accordance with a first aspect of the invention there is provided a bidirectional port for digital audio data, comprising an I/O circuit including a connector having at least one signal terminal and also including a coupling circuit connected to said signal terminal and having first and second coupling circuit terminals, and a transceiver having first and second I/O terminals connected to said first and second coupling circuit terminals respectively and including a receiver having a first input terminal connected to the first I/O terminal, a second input terminal connected to the second I/O terminal, and at least one signal output terminal, a termination circuit connected between said first and second I/O terminals and including a resistor and a switch connected in series, the switch having an open state and a closed state, and a driver having at least one signal input terminal and also having first and second output terminals connected respectively to the I/O terminals of the transceiver, the driver having an enabled state and a disabled state, whereby the transceiver has multiple modes of operation depending on at least the state of the driver and the state of the switch.

In accordance with a second aspect of the invention there is provided a modular product for audio and video processing, comprising a digital video input port for receiving a digital video data stream, a processor for processing the digital video data stream and a digital audio data stream, and a digital audio transceiver for receiving or outputting the digital audio data stream, said digital audio, transceiver having first and second I/O terminals and including a receiver having a first input terminal connected to the first I/O terminal, a second input terminal connected to the second I/O terminal, and at least one signal output terminal connected to the processor, a termination circuit connected between said first and second I/O terminals and including a resistor and a switch connected in series, the switch having an open state and a closed state, and a driver having at least one signal input terminal connected to the processor and also having first and second output terminals connected respectively to the I/O terminals of the transceiver, the driver having an enabled state and a disabled state, whereby the digital audio transceiver has multiple modes of operation depending on at least the state of the driver and the state of the switch.

In accordance with a third aspect of the invention there is provided apparatus for audio and video processing, comprising a digital video input port for receiving a digital video data stream, a processor for processing the digital video data stream and a digital audio data stream, and a digital audio I/O port for receiving or outputting the digital audio data stream, the digital audio I/O port including an I/O circuit including a connector having at least one signal terminal and also including a coupling circuit connected to said signal terminal and having first and second coupling circuit terminals, and a digital audio transceiver having first and second I/O terminals connected to said first and second coupling circuit terminals respectively and including a receiver having a first input terminal connected to the first I/O terminal, a second input terminal connected to the second I/O terminal, and at least one signal output terminal connected to the processor, a termination circuit connected between said first and second I/O terminals and including a resistor and a switch connected in series, the switch having an open state and a closed state, and a driver having at least one signal input terminal connected to the processor and also having first and second output terminals connected respectively to the I/O terminals of the transceiver, the driver having an enabled state and a disabled state, whereby the digital audio transceiver has multiple modes of operation depending on at least the state of the driver and the state of the switch.

In accordance with a fourth aspect of the invention there is provided a method of making an active circuit assembly, said method comprising providing an active circuit module having an interconnection means for receiving an input signal and having an output for providing an output signal, providing a first interface module, said first interface module being a balanced interface module having two input terminals for receiving an input signal and having an interconnection means complementary to and releasably engageable with the interconnection means of the active circuit module for providing the input signal to the active circuit module, providing a second interface module, said second interface module being an unbalanced interface module having an input terminal for receiving an input signal and having an interconnection means complementary to and releasably engageable with the interconnection means of the active circuit module for providing the input signal to the active circuit module, selecting one of the first and second interface modules, and engaging the interconnection means of the selected interface module with the interconnection means of the active circuit module, whereby the selected interface module and the active circuit module are electrically connected and form the active circuit assembly, the input signal received by the selected interface module is supplied to the active circuit module, and the active circuit module provides an output signal that reflects the input signal.

In accordance with a fifth aspect of the invention there is provided a method of manufacturing an active circuit assembly, said method comprising providing an active circuit module having an input for receiving an input signal and having an interconnection means for providing an output signal, providing a first interface module, said first interface module being a balanced interface module having two output terminals for providing an output signal and having an interconnection means complementary to and releasably engageable with the interconnection means of the active circuit module for receiving the output signal provided by the active circuit module, providing a second interface module, said second interface module being an unbalanced interface module having an output terminal for providing an output signal and having an interconnection means complementary to and releasably engageable with the interconnection means of the active circuit module for receiving the output signal provided by the active circuit module, selecting one of the first and second interface modules, and engaging the interconnection means of the selected interface module with the interconnection means of the active circuit module, whereby the selected interface module and the active circuit module are electrically connected and form the active circuit assembly, the output signal provided by the active circuit module is provided to the selected interface module, and the selected interface module provides an output signal that reflects the input signal received by the active circuit module.

In accordance with a sixth aspect of the invention there is provided a bidirectional serial port for digital audio data, comprising a cable connector for coupling the port to a cable; a cable driver having a serial digital audio signal as an input and also having an output; a receiver having an input and an output; an impedance and level matching network coupled to the output of the cable driver, the input of the receiver, and the cable connector; and a means for selectively configuring the port either as an input port by causing the impedance and level matching network to act as a cable termination or as an output port by allowing the serial digital audio signal to pass through the cable driver and the impedance and level matching network to the cable connector.

In accordance with a seventh aspect of the invention there is provided a method of making a bidirectional serial port for digital audio data, said method comprising providing an active circuit including a cable driver having an input for receiving a serial digital audio signal and also having first and second output terminals, a receiver having first and second input terminals and an output, and an interface circuit connected to the first and second output terminals of the cable driver and to the first and second input terminals of the receiver and having first and second I/O terminals, providing a first passive circuit comprising a balanced cable connector and an impedance and level matching network coupled to the balanced cable connector, the impedance and level matching network of the first passive circuit having first and second I/O terminals, providing a second passive circuit comprising an unbalanced cable connector and an impedance and level matching network coupled to the unbalanced cable connector, the impedance and level matching network of the second passive circuit having at least one I/O terminal, and selecting either the first or second passive circuit and, in the event of selecting the first passive circuit, connecting the first and second I/O terminals of the impedance and level matching network of the first passive circuit to the first and second I/O terminals respectively of the interface circuit, whereby the active circuit and the first passive circuit function as a balanced port and in a first configuration of the active circuit the interface circuit and the impedance and level matching network of the first passive circuit act as a cable termination for a serial digital audio data signal in accordance with a first interconnection standard and in a second configuration of the active circuit the interface circuit and the impedance and level matching network output the serial digital audio signal to the balanced cable connector with a voltage level in accordance with the first standard, and in the event of selecting the second passive circuit, connecting the I/O terminal of the second passive circuit to one of the I/O terminals of the interface circuit, whereby the active circuit and the second passive circuit function as an unbalanced port and in a first configuration of the active circuit the interface circuit and the impedance and level matching network of the second passive circuit act as a cable termination for a serial digital audio data signal in accordance with a second interconnection standard and in a second configuration of the active circuit the interface circuit and the impedance and level matching network output the serial digital audio signal to the unbalanced cable connector with a voltage level in accordance with the second standard.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
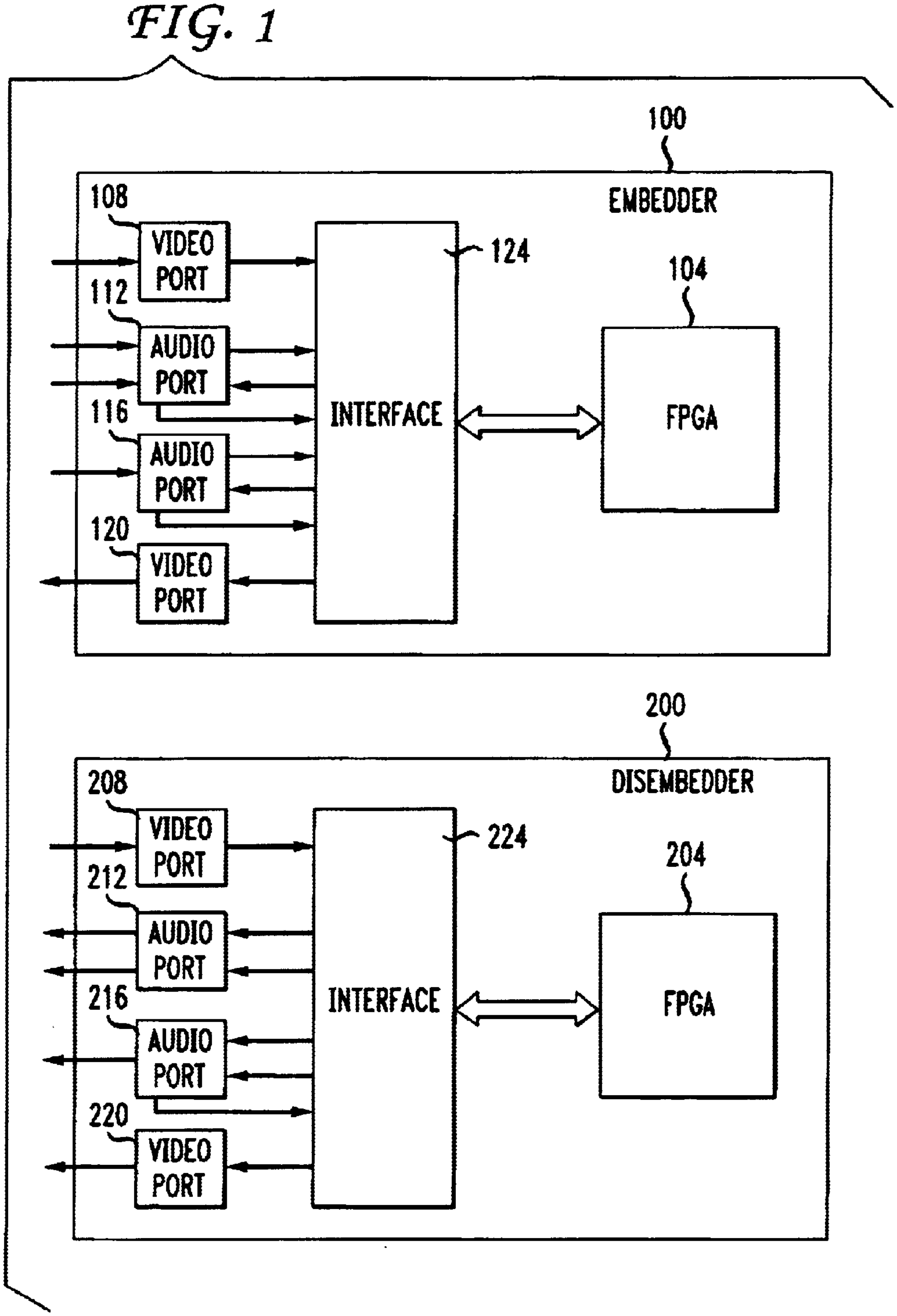
FIG. 1 is a schematic block diagram illustrating two modular products for video processing.

FIG. 1 shows in simplified block diagram form two modular products for video processing. These two modular products might be positioned side-by-side in a mounting frame installed in a standard equipment rack. One of the products is an audio embedder 100 which receives an input SDI video signal in accordance with SMPTE 259M and two AES digital audio signals and embeds the digital audio data in the video signal in accordance with SMPTE 272M and provides an output SDI video signal. The other product is a disembedder 200 which receives an SDI video signal with four or more channels of digital audio data embedded therein in accordance with SMPTE 272M and disembeds the digital audio data from the SDI video data stream and provides two AES digital audio signals and an SDI output video signal.

The embedding function of the embedder 100 may be performed by a field programmable gate array (FPGA) 104 and the disembedding function of the disembedder 200 may be performed by an FPGA 204. The FPGA 204 is structurally the same as the FPGA 104, but its operation is controlled by different software. The embedder 100 includes a video input port 108 for receiving the SDI video input signal, two AES input ports 112, 116 for receiving the AES signals and a video output port 120 for outputting the SDI video signal with the digital audio data embedded therein. The embedder 100 further includes an interface 124 between the ports 108–120 and the FPGA 104. The interface 124 might include circuit blocks that perform such functions as frame synchronizing, audio delay and audio and video processing. Similarly, the disembedder 200 includes a video input port 208, two AES output ports 212, 216, a video output port 220 and an interface 224. The video input and output ports 108, 120, 208, and 220 may be of conventional form. The AES ports 112 and 212 are balanced ports and each is provided with a connector suitable for use with a twisted pair cable. The AES ports 116, 216 are unbalanced ports and each is provided with a BNC connector for connection to a coaxial cable.

Some or all functions of the interface 124 or 224 may be performed by the FPGA 104 or 204, as the case may be, in which case there might not be an interface as a functional block separate from the FPGA.

Each AES port is coded to indicate whether it is balanced or unbalanced. For example, each port may have a coding node, which is either connected to a logic 1 level or a logic 0 level, depending on the character of the port (balanced or unbalanced). The coding node is connected to the interface 124 or 224, as the case may be, which detects the logic level of the coding node and thereby determines the character of the port. Alternatively, a group of ports may share a coding node that is connected to logic 1 level or logic 0 level to indicate the character of the ports.

Figure 2:
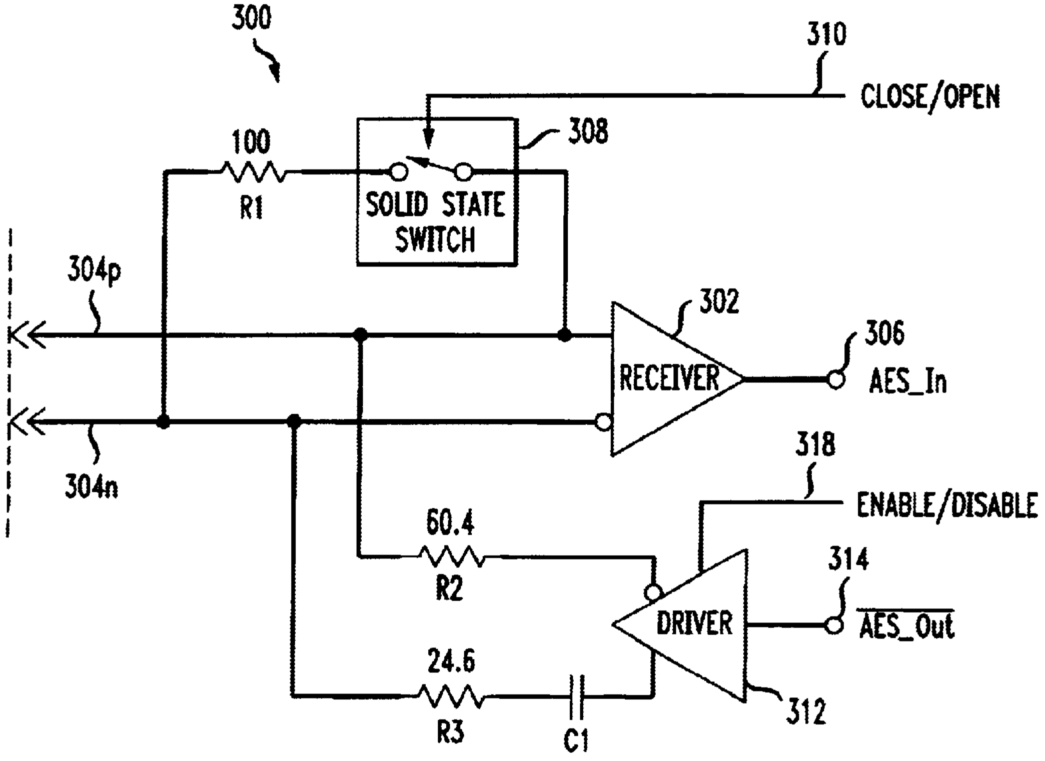
FIG. 2 is a schematic diagram of a universal AES transceiver.

Each of the AES ports includes a transceiver 300. Referring to FIG. 2, the transceiver 300 includes a receiver 302 having noninverting and inverting inputs connected to circuit nodes 304*p*, 304*n* and a single-ended output connected via an output terminal 306 to the interface 124 or 224. A series combination of a resistor R1 and a solid state switch 308 is connected between the nodes 304. The state of the switch 308 depends on the level of a discrete logic signal 310 supplied by the interface. When the logic signal 310 is high, the switch 308 is closed (conductive) whereas when the logic signal 310 is low, the switch 308 is open (nonconductive). The transceiver also includes a driver 312 having an input connected to the interface 124 or 224 via a terminal 314 and an inverter (not shown) and also having an inverting output connected through a resistor R2 to the node 304*p* and a noninverting output connected through a capacitor C1 and a resistor R3 to the node 304*n*. The state of the driver 312 depends on the level of a second discrete logic signal 318 supplied by the interface. When the signal 318 is high, the. driver 312 is enabled and provides a balanced output signal representative of the input signal applied to the terminal 314 whereas when the logic signal 318 is low, the driver is disabled and presents a high impedance to the nodes 304. The interface asserts the signals 310 and 318 depending on the character of the AES port.

Figure 3A:
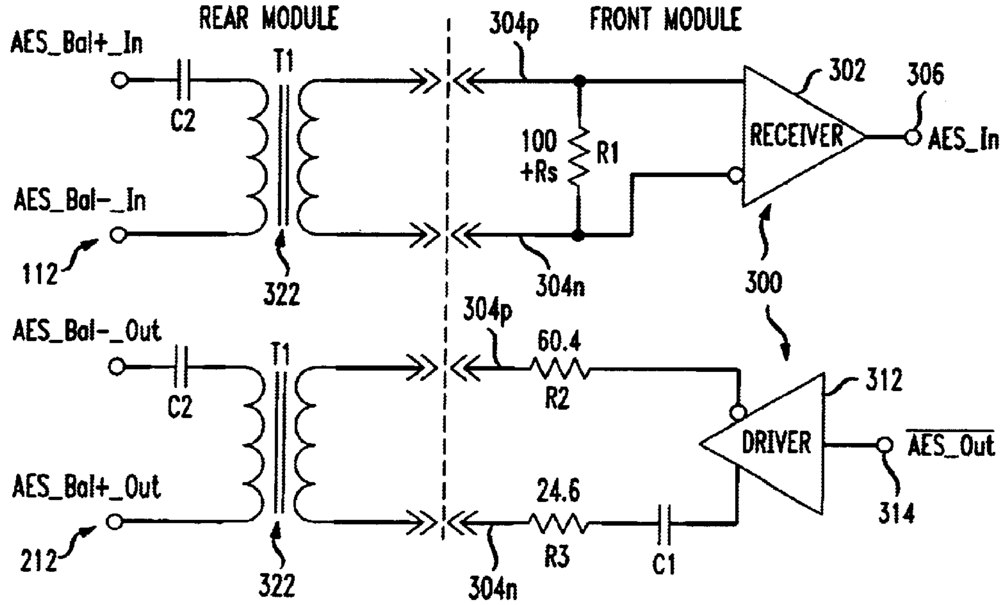
FIG. 3A is a schematic diagram illustrating two possible configurations of a combination of the transceiver and a first passive I/O circuit.
Figure 3B:
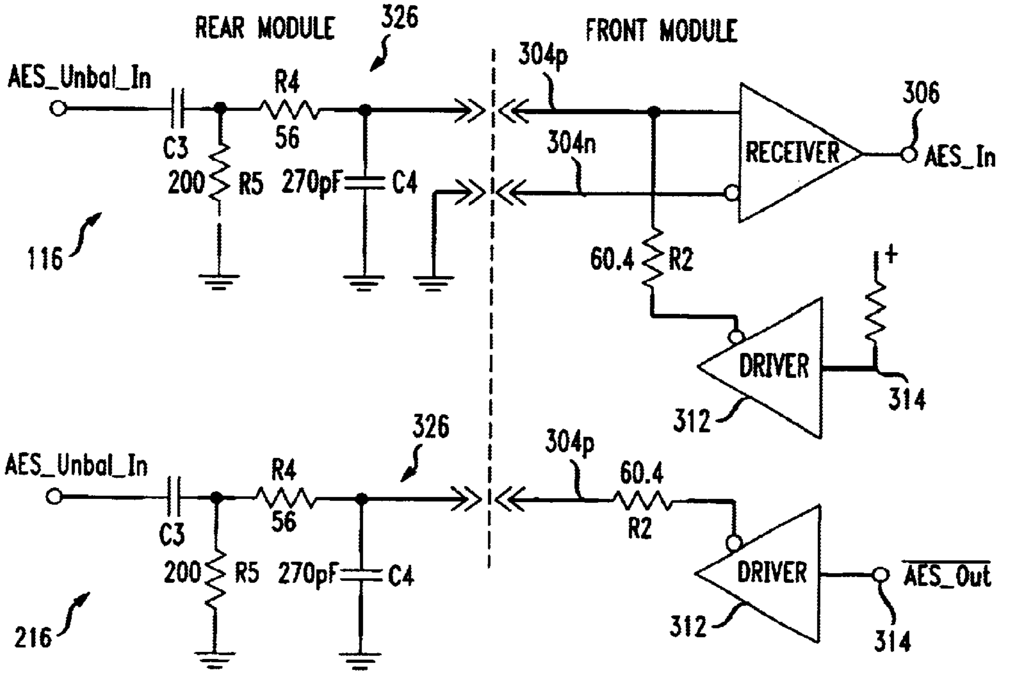
FIG. 3B is a schematic diagram illustrating two possible configurations of a combination of the transceiver and a second passive I/O circuit.

FIGS. 3A and 3B each illustrate an input port and an output port. Each port includes a transceiver in accordance with FIG. 2, but FIGS. 3A and 3B show only those parts of the transceiver that are relevant to the character of the port that is illustrated.

Each of the balanced AES ports 112, 212 includes a passive I/O circuit 322. Referring to FIG. 3A, the passive I/O circuit 322 comprises a capacitor C2 and a 1:1 transformer T1 for DC blocking and for rejection of common mode interference. The transformer primary and the capacitor C2 are connected between the signal pins of the port's connector.

In the case of the balanced input port 112, the signal 310 is high and the signal 318 is low. The switch 308 is closed and so the resistor R1 is connected between the nodes 304. The driver 312 is disabled; it produces no output signal and presents a high impedance to the nodes 304. The receiver 302 has a high input impedance and the combination of the input impedance of the receiver 302 and the resistance of the resistor R1 is within the range prescribed in AES3-1992.

In the case of the balanced output port 212, the signal 310 is low and accordingly the switch 308 is open. The signal 318 is high and the driver 312 is enabled. The signal applied to the input of the driver 312 generates a differential signal between the nodes 304. The driver 312 feeds the transformer T1 via the resistors R2 and R3 and the DC blocking capacitor C1. The high input impedance of the receiver 302 ensures that the receiver has no significant effect on the signal at the nodes 304. The effective output impedance is the sum of the driver output impedance and the two series resistors R2, R3. The asymmetry arising from the different resistance values of the two series resistors R2, R3 is removed by the AC coupling by the capacitor C1. The division of the required total resistance between the two resistors R2, R3 is determined by the value calculated for the resistor R2 in the case of the unbalanced output port 216.

The circuit composed of the driver 312, the resistors R2 and R3, the transformer T1 and the capacitor C2 complies with the recommendations of AES3-1992 for a balanced line driver circuit.

Referring to FIG. 3B, each of the unbalanced AES ports 116, 216 includes a passive I/O circuit 326. The passive I/O circuit 326 comprises a series capacitor C3 and series resistor R4 and a parallel resistor R5 and a parallel capacitor C4. The capacitor C3 and the resistor R4 are connected in series between the center conductor of the BNC connector and the node 304*p*. The node 304*n* is grounded.

In the case of the unbalanced input port 116, the unbalanced signal is applied to the node 304_p_ through the RC network composed of the resistors R4, R5 and the capacitors C3, C4. The switch 308 is open. The driver 312 is enabled. The interface 124 holds the terminal 314 at a logic high level and accordingly the inverting input of the driver is an effective ground. The effective input impedance is the combination of the nominal 200 ohm resistor R5 in parallel with the series combination of the nominal 56 and 60.4 ohm resistors R4 and R2. The three resistor values are chosen in accordance with the requirements calculated for the case of the unbalanced output port 216 and are such that the effective input impedance meets the requirements of SMPTE 276M (nominally 75 ohm).

In the case of the unbalanced output port 216, the switch 308 is open and the driver 312 is enabled. The unbalanced AES output signal is applied through the resistors R2, R4 and the coupling capacitor C3 to the center conductor of the BNC connector. The resistance values of the potential divider composed of the resistors R2, R4 and R5 are chosen so that the output level of the driver 312 (which must meet the requirements of AES3-1992 in the case of the port 212) is attenuated to meet the requirements of SMPTE 276M. This requirement may be met by a number of combinations; actual values for driver output level and resistor values are determined by considering that the driver output level must fall within the range permitted by AES3-1992, this level must be attenuated by the resistor network to meet the requirements of SMPTE 276M, and the input and output impedances must meet the requirements of SMPTE 276M, as discussed in connection with the port 116.

The series capacitors C1–C3 are for DC blocking and must be sufficiently large to present an impedance that is small compared to other circuit elements over the frequency range of interest (100 kHz to 6.144 MHz). In one implementation, a value of 2.2 muF was found suitable.

The parallel capacitor C4 limits the rise time of the output signal provided by the driver 312 when the port operates as an output port and the driver generates a transition with a rise time faster than permitted by SMPTE 276M. It has no substantive effect when the port operates as an input port. A typical value for the capacitor C4 is 270 pF.

As suggested by the connectors shown schematically in FIGS. 3A and 3B, each pair of audio ports may conveniently be distributed between two circuit modules. In a preferred implementation of the invention, employing a midplane configuration with a front module and a rear module as described, for example, in U.S. patent application Ser. No. 09/551,747, filed Apr. 18, 2000, the entire disclosure of which is hereby incorporated by reference herein for all purposes, the passive I/O circuits and the balanced and/or unbalanced cable connectors are provided on the rear module and the transceiver, interface and FPGA are provided on the front module. There are no active components, which are more likely to fail, on the rear module, which is more difficult to replace. The necessary electrical connections are established when the connectors at the rear of the front module and the connectors at the front of the rear module engage each other and the motherboard connectors, as described in patent application Ser. No. 09/551,747. In particular, when the rear module engages the motherboard connector the coding node of each passive I/O circuit is connected to the appropriate logic level, depending on the character of the port, and the coding nodes of the several ports are connected through the module-to-module connectors to the interface 124 or 224, allowing the interface to detect the character of each port.

It will be appreciated that the example of an embedder and a disembedder and the specific mix of balanced and unbalanced AES ports described above have been selected to illustrate the different configurations that are possible and that the invention is not restricted to the passive I/O circuits of two AES ports for either product being balanced and unbalanced respectively and that both ports may be balanced or both may be unbalanced. Further, the invention is not restricted to the product having two AES ports and in a particular application of the invention, the product may have fewer than two AES ports or more than two AES ports.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

What is claimed is:

1. A bidirectional port for digital audio data, comprising:

an I/O circuit including a connector having two signal terminals and also including a coupling means connected to said signal terminal and having first and second coupling means terminals, the coupling means including one of (a) a balanced coupler including transformer having first and second windings each with two opposite ends, the two opposite ends of the first winding are connected to said two signal terminals respectively, and the two opposite ends of the second winding are connected respectively to said first and second coupling means terminals to provide a balanced input or output or (b) an unbalanced coupler including resistive means and capacitive means connected between said single signal terminal and the first coupling means terminal, and the second coupling means terminal is connected to ground a transceiver having first and second I/O terminals connected to said first and second coupling means terminals respectively and including:

a receiver having a first input terminal connected to the first I/O terminal, a second input terminal connected to the second I/O terminal, and at least one signal output terminal, a termination circuit connected between said first and second I/O terminals and including a resistor and a switch connected in series, the switch having an open state and a closed state, and a driver having at least one signal input terminal and also having first and second output terminals connected respectively to the I/O terminals of the transceiver, the driver having an enabled state and a disabled state, whereby the transceiver has multiple modes of operation depending on at least the state of the driver and the state of the switch.

2. A port according to claim 1, wherein the balanced coupler further includes a DC blocking capacitor connected between one end of the first winding of the transformer and a signal terminal of the connector.

3. A modular product for audio and video processing, comprising:

a digital video input port for receiving a digital video data stream, a processor for processing the digital video data stream and a digital audio data stream, an I/O circuit including a connector having two signal terminals and also including a coupling means connected to said signal terminal and having first and second coupling means terminals, the coupling means including one of (a) a balanced coupler including transformer having first and second windings each with two opposite ends, the two opposite ends of the first winding are connected to said two signal terminals respectively, and the two opposite ends of the second winding are connected respectively to said first and second coupling means terminals to provide a balanced input or output or (b) an unbalanced coupler including resistive means and capacitive means connected between said single signal terminal and the first coupling means terminal, and the second coupling means terminal is connected to ground;

a digital audio transceiver for receiving or outputting the digital audio data stream, said digital audio transceiver having first and second I/O terminals and including:

a receiver having a first input terminal connected to the first I/O terminal, a second input terminal connected to the second I/O terminal, and at least one signal output terminal connected to the processor, a termination circuit connected between said first and second I/O terminals and including a resistor and a switch connected in series, the switch having an open state and a closed state, and a driver having at least one signal input terminal connected to the processor and also having first and second output terminals connected respectively to the I/O circuit signal terminals of the transceiver, the driver having an enabled state and a disabled state, whereby the digital audio transceiver has multiple modes of operation depending on at least the state of the driver and the state of the switch.

4. Apparatus for audio and video processing, comprising a digital video input port for receiving a digital video data stream, a processor for processing the digital video data stream and a digital audio data stream, and a digital audio I/O port for receiving or outputting the digital audio data stream, the digital audio I/O port including:

an I/O circuit including a connector having at two signal terminals and also including coupling means connected to said signal terminal and having first and second coupling means terminals, the coupling means including one of (a) a balanced coupler including transformer having first and second windings each with two opposite ends, the two opposite ends of the first winding are connected to said two signal terminals respectively, and the two opposite ends of the second winding are connected respectively to said first and second coupling means terminals to provide a balanced input or output or (b) an unbalanced coupler including resistive means and capacitive means connected between said single signal terminal and the first coupling means terminal, and the second coupling means terminal is connected to ground;

a digital audio transceiver having first and second I/O terminals connected to said first and second coupling means terminals respectively and including:

a receiver having a first input terminal connected to the first I/O terminal, a second input terminal connected to the second I/O terminal, and at least one signal output terminal connected to the processor, a termination circuit connected between said first and second I/O terminals and including a resistor and a switch connected in series, the switch having an open state and a closed state, and a driver having at least one signal input terminal connected to the processor and also having first and second output terminals connected respectively to the I/O terminals of the transceiver, the driver having an enabled state and a disabled state, whereby the digital audio transceiver has multiple modes of operation depending on at least the state of the driver and the state of the switch.

5. Apparatus according to claim 4, further comprising a means for detecting a characteristic of the I/O circuit and setting the mode of operation of the digital audio transceiver depending on the detected characteristic.

6. A method of making an active circuit assembly, said method comprising:

providing an active circuit module having an interconnection means for receiving an input signal and having an output for providing an output signal, providing a first interface module, said first interface module being a balanced interface module having two input terminals for receiving an input signal and having an interconnection means complementary to and releasably engageable with the interconnection means of the active circuit module for receiving the output signal provided by the active circuit module, providing a second interface module, said second interface module being an unbalanced interface module having an output terminal for providing an output signal and having an interconnection means complementary to and releasably engageable with the interconnection means of the active circuit module for receiving the output signal provided by the active circuit module, selecting one of the first and second interface modules, and engaging the interconnection means of the selected interface module with the interconnection means of the active circuit module, whereby the selected interface module and the active circuit module are electrically connected and form the active circuit assembly, the output signal provided by the active circuit module is provided to the selected interface module, and the selected interface module provides an output signal that reflects the input signal received by the active circuit module.

7. A method according to claim 6, wherein the active circuit assembly is a signal driver.

8. A method according to claim 6, wherein the selected interface module is a passive interface module.

9. A method of manufacturing an active circuit assembly, said method comprising:

providing an active circuit module having an input for receiving an input signal and having an interconnection means for providing an output signal, providing a first interface module, said first interface module being a balanced interface module having two output terminals for providing an output signal and having an interconnection means complementary to and releasably engageable with the interconnection means of the active circuit module for receiving the output signal provided by the active circuit module, providing a second interface module, said second interface module being an unbalanced interface module having an output terminal for providing an output signal and having an interconnection means complementary to and releasably engageable with the interconnection means of the active circuit module for receiving the output signal provided by the active circuit module, selecting one of the first and second interface modules, and engaging the interconnection means of the selected interface module with the interconnection means of the active circuit module, whereby the selected interface module and the active circuit module are electrically connected and form the active circuit assembly, the output signal provided by the active circuit module is provided to the selected interface module, and the selected interface module provides an output signal that reflects the input signal received by the active circuit module.

10. A method according to claim 9, wherein circuit assembly is a signal receiver.

11. A method according to claim 9, wherein the selected interface module is a passive interface module.

12. A bidirectional serial port for digital audio data comprising:

an I/O circuit including a connector for coupling the port to a cable, the circuit having two signal terminals and also including coupling mean connected to said signal terminal and having first and second coupling means terminals, the coupling means including one of (a) a balanced coupler including transformer having first and second windings each with two opposite ends, the two opposite ends of the first winding are connected to said two signal terminals respectively, and the two opposite ends of the second winding are connected respectively to said first and second coupling means terminals to provide a balanced input or output or (b) an unbalanced coupler including resistive means and capacitive means connected between said single signal terminal and the first coupling means terminal, and the second coupling means terminal is connected to around;

a cable driver having a serial digital audio input and also having an output;

a receiver having an input and an output;

an impedance and level matching network coupled to the output of the cable driver, the input of the receiver, and the cable connector; and a means for selectively configuring the port either as an input port by causing the impedance and level matching network to act as a cable termination or as an output port by allowing the serial digital audio signal to pass through the cable driver and the impedance and level matching network to the cable connector.

13. A method of making a bidirectional serial port for digital audio data, said method comprising:

providing an active circuit including a cable driver having an input for receiving a serial digital audio signal and also having first and second output terminals, a receiver having first and second input terminals and an output, and an interface circuit connected to the first and second output terminals of the cable driver and to the first and second input terminals of the receiver and having first and second I/O terminals, providing a first passive circuit comprising a balanced cable connector and an impedance and level matching network coupled to the balanced cable connector, the impedance and level matching network of the first passive circuit having first and second I/O terminals, providing a second passive circuit comprising an unbalanced cable connector and an impedance and level matching network coupled to the unbalanced cable connector, the impedance and level matching network of the second passive circuit having at least one I/O terminal, and selecting either the first or second passive circuit and, in the event of selecting the first passive circuit, connecting the first and second I/O terminals of the impedance and level matching network of the first passive circuit to the first and second I/O terminals respectively of the interface circuit, whereby the active circuit and the first passive circuit function as a balanced port and in a first configuration of the active circuit the interface circuit and the impedance and level matching network of the first passive circuit act as a cable termination for a serial digital audio data signal in accordance with a first interconnection standard and in a second configuration of the active circuit the interface circuit and the impedance and level matching network output the serial digital audio signal to the balanced cable connector with a voltage level in accordance with the first standard, and in the event of selecting the second passive circuit, connecting the I/O terminal of the second passive circuit to one of the I/O terminals of the interface circuit, whereby the active circuit and the second passive circuit function as an unbalanced port and in a first configuration of the active circuit the interface circuit and the impedance and level matching network of the second passive circuit act as a cable termination for a serial digital audio data signal in accordance with a second interconnection standard and in a second configuration of the active circuit the interface circuit and the impedance and level matching network output the serial digital audio signal to the unbalanced cable connector with a voltage level in accordance with the second standard.

14. A method according to claim 13, wherein the interface circuit includes a resistor and a switch connected in series between the input terminals of the receiver.

15. A method according to claim 13, wherein the driver can selectively disabled or enabled.

* * * * *